United States Patent [19]
Go et al.

[11] Patent Number: 5,347,604
[45] Date of Patent: Sep. 13, 1994

[54] TRANSFER MOLDING TYPE MANUFACTURING METHOD OF PIGTAIL-TYPE OPTICAL MODULE

[75] Inventors: Hisao Go; Mitsuaki Nishie; Keiichi Imamura, all of Kanagawa, Japan

[73] Assignee: Sumitomo Electric Industries, Ltd., Osaka, Japan

[21] Appl. No.: 72,455

[22] Filed: Jun. 7, 1993

[30] Foreign Application Priority Data

Jun. 8, 1992 [JP] Japan .................. 4-173807

[51] Int. Cl.$^5$ .............................. G02B 6/36
[52] U.S. Cl. ........................ 385/92; 385/93; 385/91; 385/90
[58] Field of Search ............... 264/1.1, 1.5; 385/88-94

[56] References Cited

U.S. PATENT DOCUMENTS

| | | | |
|---|---|---|---|
| H551 | 12/1988 | Chaoui et al. | 385/90 |
| 4,997,252 | 3/1991 | Sugawara et al. | 350/96.2 |
| 5,047,835 | 9/1991 | Chang | 385/92 |
| 5,109,454 | 4/1992 | Okuno et al. | 385/92 |
| 5,208,888 | 4/1993 | Steinblatt et al. | 385/90 |

FOREIGN PATENT DOCUMENTS

| | | |
|---|---|---|
| 313956 | 5/1989 | European Pat. Off. . |
| 351211 | 1/1990 | European Pat. Off. . |
| 441001 | 8/1991 | European Pat. Off. . |
| 472755 | 3/1992 | European Pat. Off. . |

*Primary Examiner*—Rodney B. Bovernick
*Assistant Examiner*—John Ngo
*Attorney, Agent, or Firm*—Cushman, Darby & Cushman

[57] ABSTRACT

A sub-assembly containing an optical element and having a holder portion into which a ferrule that is attached to the end portion of an optical fiber can be inserted with sufficient gap, an electronic circuit electrically connected to the optical element, and a lead frame are molded with a transfer mold resin to produce a molded sub-assembly. The ferrule is inserted into the holder portion of the molded subassembly, and the optical coupling efficiency between the optical fiber and the optical element is adjusted while moving the ferrule in the ferrule insertion direction, a direction perpendicular thereto or by rotating the ferrule.

5 Claims, 6 Drawing Sheets

TRANSFER MOLDING TYPE MANUFACTURING METHOD OF PIGTAIL-TYPE OPTICAL MODULE

BACKGROUND OF THE INVENTION

The present invention relates to a manufacturing method of optical modules. More specifically, the invention relates to a novel manufacturing method of a pigtail-type optical module in which an electronic circuit including an optical element (photoelectric conversion element or electrooptical conversion element) and an optical fiber for introducing an optical signal to the optical element or extracting an optical signal from the optical element are coupled to form a single unit.

In the pigtail-type optical module, an electronic circuit including an optical element (light-emitting element and/or photodetecting element) and an optical fiber for introducing an optical signal to the optical element or extracting an optical single from it are coupled to form a signal unit. That is, the pigtail-type optical module is mounted on a circuit board together with electronic circuits etc. appropriate for the purpose, and serves as a component interfacing between the electronic circuits and an optical signal transmission line.

FIG. 9 shows a structure and a manufacturing method of a conventional pigtail-type optical module which is a light transmission module having a laser diode (LD) as a light source.

As shown in FIG. 9, in the conventional pigtail-type optical module, a circuit board 12 on which an integrated circuit 11 is mounted and a sub-assembly 13 including an optical fiber 13a and an optical element coupled to each other to form a single assembly are incorporated in a metal package 14 to constitute a signal unit.

The optical module having the above structure is manufactured by the following process. First, the sub-assembly 13 is produced by combining, with a sheath 13c, a sub-package 13d containing the optical element and the optical fiber 13a to which a ferrule 13b is attached. Then, the sub-assembly 13 is attached to the metal package 14 having the circuit board 12, and the sub-assembly 13 and the circuit board 12 are electrically connected to each other by soldering or bonding. Finally, the metal package 14 is sealed by a cover, to become the complete optical module. The optical coupling efficiency between the optical fiber 13a and the optical element is adjusted by aligning their optical axes at the time of producing the sub-assembly 13.

In actual production of the above type of optical modules, a separately supplied sub-assembly is used which is a single component including an optical element and an optical fiber or a receptacle portion. However, even where sub-assemblies according to the same standard are used, finally produced optical modules unavoidably have a variation in optical coupling efficiency due to variations of the light output power of the optical element, dimensions of the parts used, etc. On the other hand, each of the optical communication systems etc. provide a standard defining the upper and lower limits of the input and output light powers of an optical module used therein. For those reasons, in optical module manufacturing processes, optical modules are assembled using selected sub-assemblies. The drive current etc. of each module is closely adjusted for the characteristics of the sub-assembly used. Therefore, the yield of sub-assemblies and the total productivity is low, and it is difficult to lower the price of shipped optical modules and to realize mass-production of optical modules.

As a countermeasure, it has been proposed to apply, to the optical module production process, the transfer molding technique that is employed in the packaging of mass-production-type integrated circuits. FIG. 10 shows an example of a structure of a sub-assembly to be used in manufacturing optical modules using the transfer molding technique.

As shown in FIG. 10, according to the transfer molding technique, a sub-assembly 22 including a receptacle portion 21 for receiving an optical connector connected to the end portion of an optical fiber and a light-receiving portion or light-emitting portion 25 consisting of an optical element 23, lens 24, etc. are preliminarily wired to a lead frame (not shown) on which an electronic circuit is mounted. The wired assembly is then molded with a transfer mold resin. After the molding, unnecessary portions of the lead frame are removed and the outer leads are shaped.

In the above process according to the transfer molding technique, a metal mold containing the parts needs to be heated to 150°–200° C. in the molding step. Therefore, mainly from the heat resistance of the optical fiber, it is concluded that the above process cannot be applied to the production of the pigtail-type optical module which includes even the optical fiber as a member of the single unit. Further, in another manufacturing process in which the optical fiber is attached after the transfer molding step, there is no method for adjusting the optical coupling efficiency between the optical fiber and the optical element, so that the production yield is not stable.

SUMMARY OF THE INVENTION

An object of the present invention is to provide, by solving the above problems in the art, a novel manufacturing method capable of efficiently producing a pigtail-type optical module having a predetermined optical coupling efficiency using the transfer molding technique that is suitable for mass-production.

According to the invention, a method for manufacturing a pigtail-type optical module comprising, as a single unit, an optical fiber and an optical element optically coupled to each other and an electronic circuit electrically connected to the optical element, comprises the steps of:

transfer molding a sub-assembly containing the optical element and having a holder portion capable of receiving a ferrule, and the electronic circuit electrically connected to the optical element, to produce a molded sub-assembly; and inserting the ferrule attached to an end portion of the optical fiber into the holder portion of the molded sub-assembly, and adjusting optical coupling efficiency between the optical fiber and the optical element while moving or rotating the ferrule within the molded sub-assembly.

The optical module manufacturing method of the invention is mainly characterized in that the step of attaching the optical fiber is performed after the transfer molding step., and that it is intended to enable easy and correct adjustment of the optical coupling efficiency between the optical element and the optical fiber.

That is, as described above, conventionally the pigtail-type optical module cannot be produced using the transfer molding technique because the sub-assembly having the optical fiber attached thereto cannot be introduced into a metal mold. Further, the method for adjusting the optical coupling efficiency of the optical fiber has not been established which is necessary to attach the optical fiber after the molding step.

In contrast, according to the manufacturing method of the invention, first the lead frame on which the electronic circuit is mounted and the sub-assembly including the ferrule receiving portion are transfer-molded to provide a single unit. Then, after the ferrule is attached to the end portion of the optical fiber, the ferrule is inserted into the molded sub-assembly, to thereby optically couple the optical element with the optical fiber. In this state, according to the invention, the optical coupling efficiency between the optical element and the optical fiber can be adjusted by using the optical element itself.

According to one embodiment of the invention, within the sub-assembly to be subjected to the transfer molding, the optical element is disposed so as to deviate from the optical axis of an optical system provided between the end face of the optical fiber and the optical element. With this arrangement, the adjustment of the optical coupling efficiency between the optical fiber and the optical element can be performed easily because it varies with the insertion depth of the ferrule into the sub-assembly.

According to another embodiment of the invention, in the above manufacturing method, the ferrule is connected to the sub-assembly via an intermediate member having a proper shape. As a result, it becomes possible to smoothly change the optical coupling efficiency between the optical fiber and the optical element by translating the ferrule without changing the orientation of the inserted ferrule. This makes it possible to easily perform adjustment of the optical coupling efficiency.

According to still another embodiment, in the above manufacturing method, the end face of the optical fiber (actually, together with the end face of the ferrule) is preliminarily ground so as to be inclined from the plane perpendicular to the optical axis of the optical fiber end portion. As a result of this grinding, the optical coupling efficiency between the optical fiber and the optical element varies in accordance with the rotation angle of the ferrule. Therefore, it becomes possible to easily perform adjustment of the optical coupling efficiency.

According to the manufacturing method of the invention as summarized above, the pigtail-type optical module can be produced using the transfer molding technique, which is suitable for mass-production and capable of reducing the production cost. Further, the optical coupling efficiency between the optical fiber and the optical element in the optical module can be adjusted with high accuracy and ease of operation. As a result, it becomes possible to relax the standard in selecting sub-assemblies based on variations in their characteristics, and to simplify or eliminate the adjustment of the drive current, to thereby enable low-cost, high-speed production of pigtail-type optical modules that satisfy desired standard of an optical communication system, etc. Further, since the manufacturing method of the invention can provide a wider adjustment range of the optical coupling efficiency, it can accommodate, for instance, a wide variety of specifications and large variations of the characteristics of the devices used.

In the following, the invention is described in detail by way of embodiments. However, it is noted that the scope of the invention is in no way limited to those embodiments.

DESCRIPTION OF THE PREFERRED EMBODIMENTS

A manufacturing method of an optical module according to the present invention, specifically a manufacturing method of an optical module using a laser diode as an optical element, is described below in detail.

Figure 1:
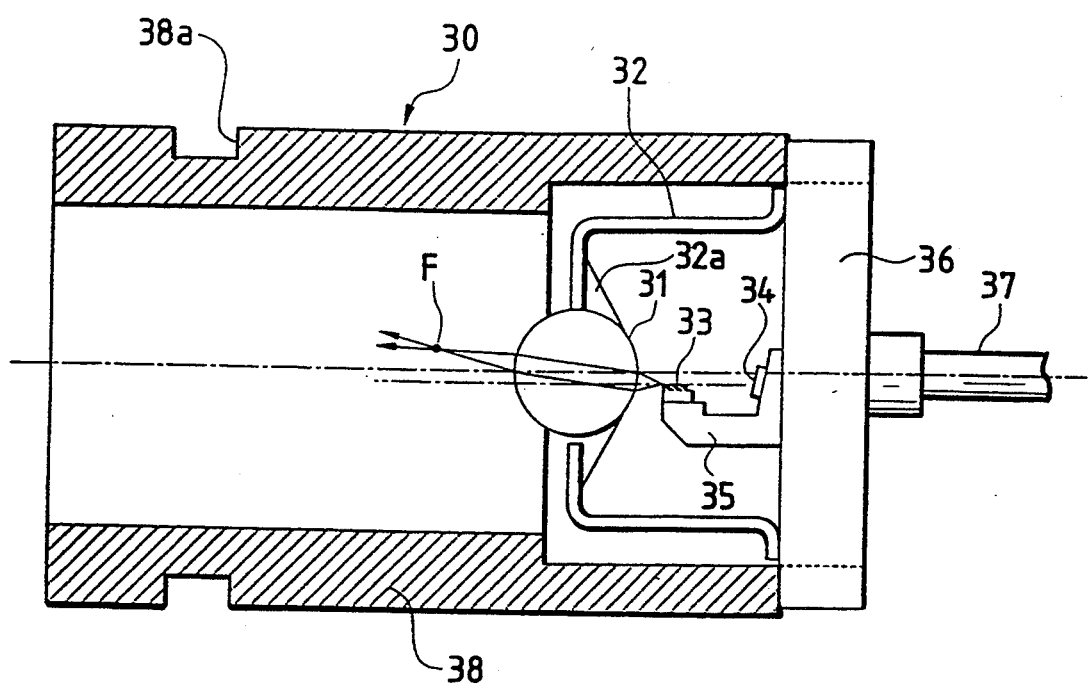
FIG. 1 is a sectional showing an example of a structure of a sub-assembly that can be used in practicing an optical module manufacturing method according to the present invention.

FIG. 1 is a sectional view showing an example of a structure of a sub-assembly 30 used in practicing an optical module manufacturing method of the invention. The sub-assembly 30 mainly consists of a cylindrical holder 38 and a disc-shaped stem 36 attached to one end of the holder 38. For convenience of handling, a groove 38a is formed in the holder 38 on its outer side. A sphere lens 31, a cap 32 for supporting it, a light-emitting element 33 and a monitor photodetecting element 34, and a sub-mount 35 for supporting the elements 33 and 34 are mounted on the inner surface of the stem 36. On the other hand, lead pins 37 for connecting the light-emitting element 33 and the monitor photodetecting element 34 to an external electronic circuit are provided outside of the stem 36.

The sphere lens 31 is fixed to the cap 32 with an adhesive 32a such as low melting point glass, and the cap 32 is welded to the stem 36 by resistance welding etc. The light-emitting element 33 and the monitor photodetecting element 34 are fixed to the sub-mount 35 by die bonding. The light-emitting element 33 and the monitor photodetecting element 34 are electrically connected to the lead pins 37 and the stem 36 directly or via wires etc. The holder 38 and the stem 36 are fixed to each other, for instance, by resistance welding or laser welding, or with an adhesive.

In the sub-assembly 30, thus constructed, while the center of the sphere lens 31 is located on the central axis of the holder 38, the light-emitting element 33 is located so as to be spaced from the central axis of the holder 38. Therefore, a focus F of light emitted from the light-emitting element 33 and converged by the sphere lens 31 deviates from the central axis of the holder 38 as shown in FIG. 1. In other words, the central axis of the light beam having the focus F and the central axis of the holder 38 form a predetermined angle. A specific distance between the light-emitting element 33 as a point light source and the central axis of the holder 38 is approximately 50–100 $\mu$m.

Although the sphere lens 31 is used as the optical system in the example of FIG. 1, an aspherical lens or a rod lens may be substituted therefor without causing any change in function. Further, the sphere lens 31, as the optical system, may be disposed such that its center is deviated perpendicularly from the central axis of the holder 38 while the light-emitting element 33 is placed on the central axis of the holder 38.

Figure 2:
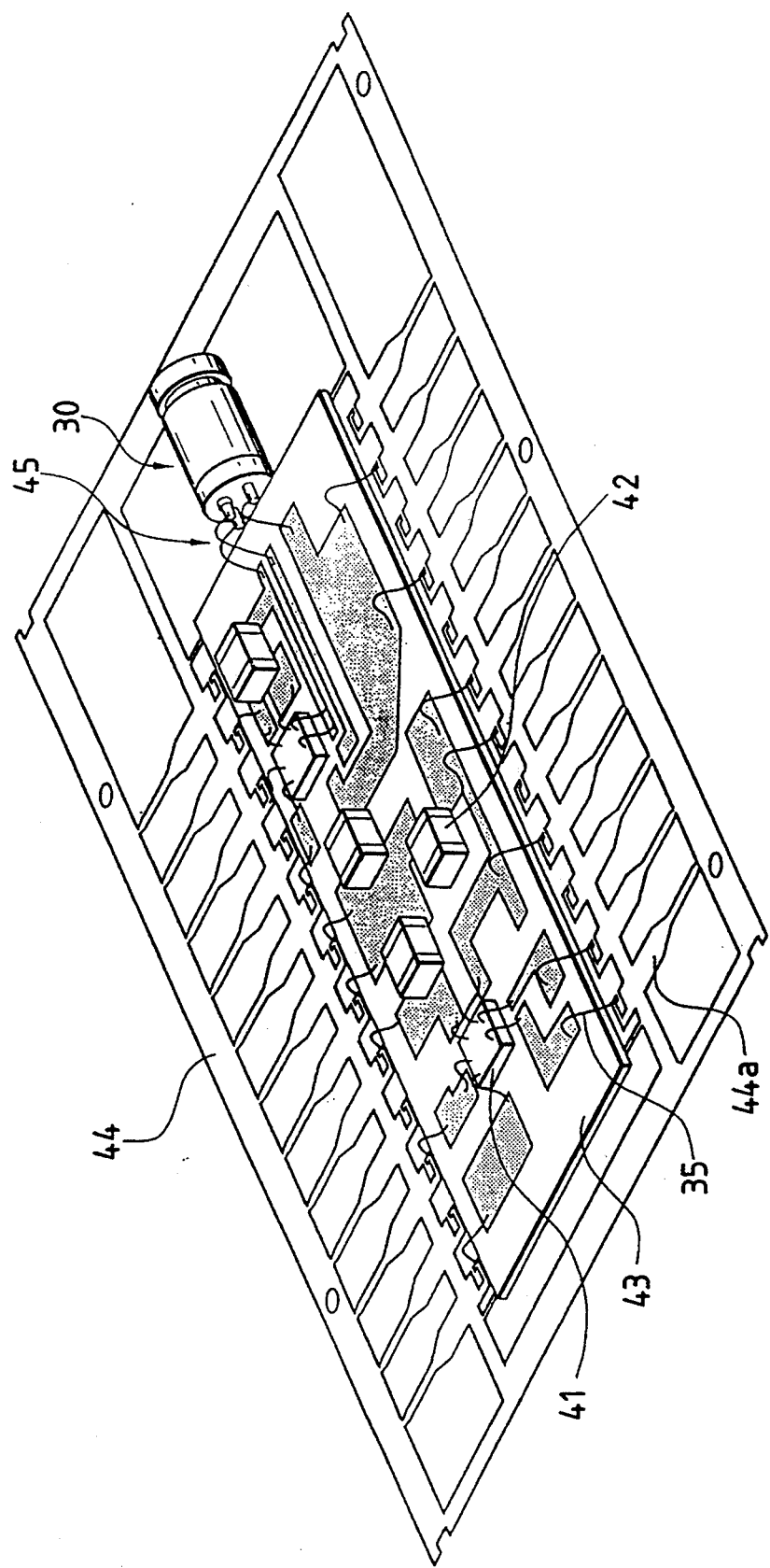
FIG. 2 is a perspective view used for describing the initial step of the optical module manufacturing method of the invention.

FIG. 2 illustrates the initial step of the optical module manufacturing process according to the invention that is practiced using the sub-assembly 30 of FIG. 1.

As shown in FIG. 2, first a ceramic circuit board 43 having a conductor pattern and resistors printed thereon is bonded to a flat lead frame 44 with a conductive resin etc. Then, IC chips 41, capacitors 42, etc., which are necessary to provide an optical module having desired functions, are mounted on the circuit board 43 by die bonding using a conductive resin, solder, etc. The sub-assembly 30 including the optical element and the optical system is also mounted on the lead frame 44. Then, pads on the circuit board 43 and the lead pins 37 of the sub-assembly 30 are electrically connected to the lead frame 44 by bonding wires 45 such as Al wires and Au wires. In this step, characteristics of a drive circuit may be adjusted by such a technique as laser trimming.

Figure 3:
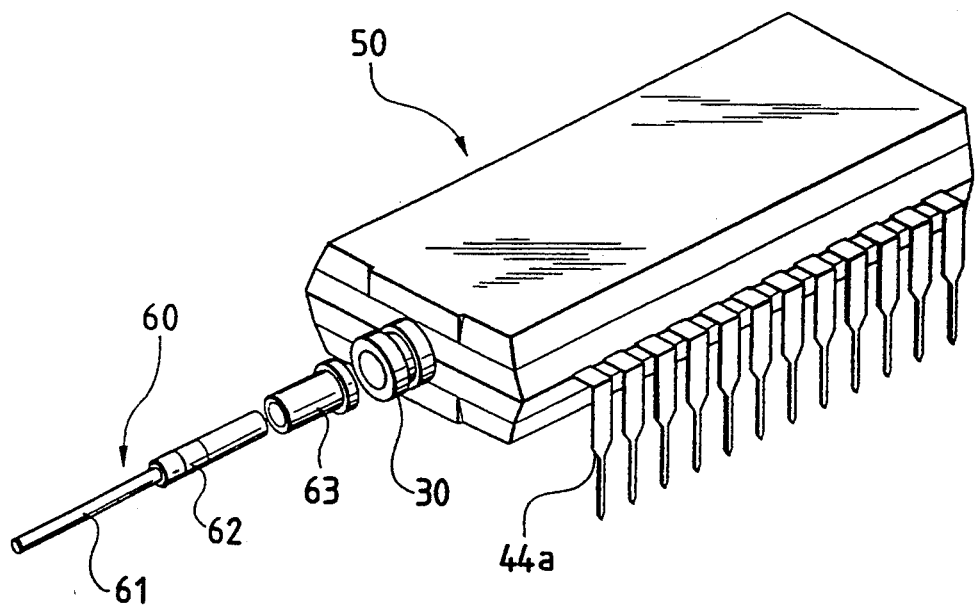
FIG. 3 is a perspective view showing an optical module immediately after completion of a transfer molding step.

In the next step, with the circuit board 43, sub-assembly 30 and lead frame 44, which has been assembled into a single unit in the above manner, are placed in a metal mold. A thermosetting resin is injected into the metal mold to effect transfer molding. Then, unnecessary portions of the lead frame 44 are removed and outer leads 44a are shaped properly. A resin package 50 as shown in FIG. 3 is obtained as a result of the above steps. As shown in FIG. 3, a pigtail unit 60 including an optical fiber 61 and a ferrule 62 is not yet attached to the package 50 at this stage.

Figure 4:
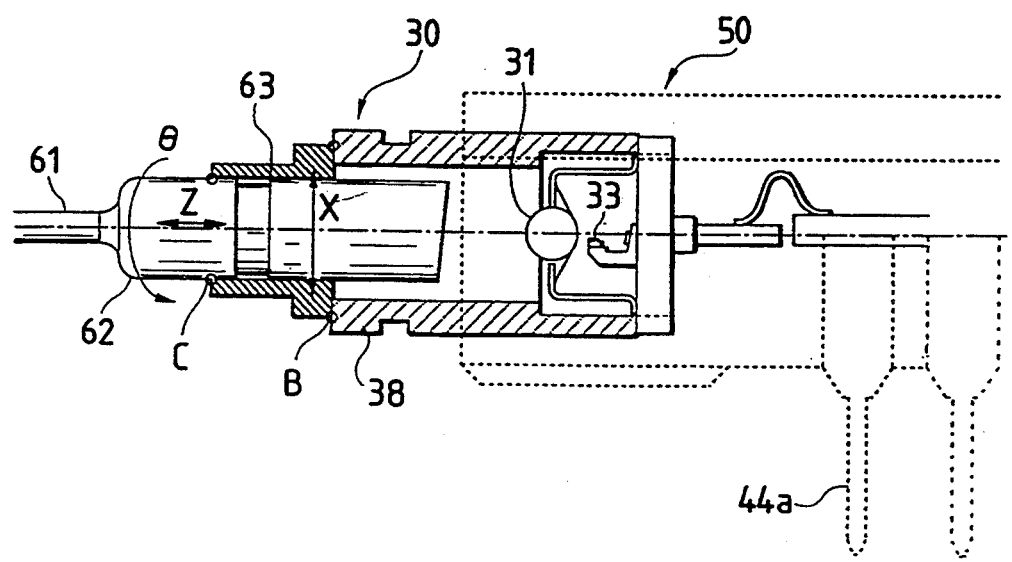
FIG. 4 is a sectional view illustrating a method of attaching an optical fiber and a ferrule to the sub-assembly.

As shown in FIG. 3, the optical fiber 61 having the ferrule 62 attached to its end portion is connected to the sub-assembly 30 via a sleeve 63. FIG. 4 is a sectional view showing in more detail how the optical fiber 61 and the ferrule 62 are connected to the sub-assembly 30.

As shown in FIG. 4, the inner diameter of the holder 38 of the sub-assembly 30 is larger than the outer diameter of the ferrule 62, and a sufficient gap exists between the holder 38 and the ferrule 62. The sleeve 63, that is inserted between the ferule 62 and the holder 38, is generally cylindrical, and its inner diameter is approximately equal to the outer diameter of the ferrule 62. One end portion of the sleeve 63 is shaped into a flange portion, which is in close contact with the end face of the holder 38 of the sub-assembly 30. Therefore, the ferrule 62 can be freely inserted into the sleeve 63, and by moving the sleeve 63 the ferrule 62 can be translated in the X-direction without changing its orientation.

In the assembled state of FIG. 4, the ferrule 62 can be positioned in three ways, i.e., advanced or retreated in the optical axis direction Z of the optical fiber 61 held by itself, translated in the X-direction perpendicular to the optical axis of the optical fiber 61 by using the sleeve 63, and rotated by an angle $\theta$ about the optical axis of the optical fiber 61. An arbitrary optical coupling efficiency can be obtained by effecting the positioning while monitoring a light output with the ferrule 62 inserted in the sleeve 63. After the adjustment, the ferrule 62 and the sleeve 63 can be fixed to the sub-assembly 30, for instance, with an adhesive or by laser welding.

Figure 5:
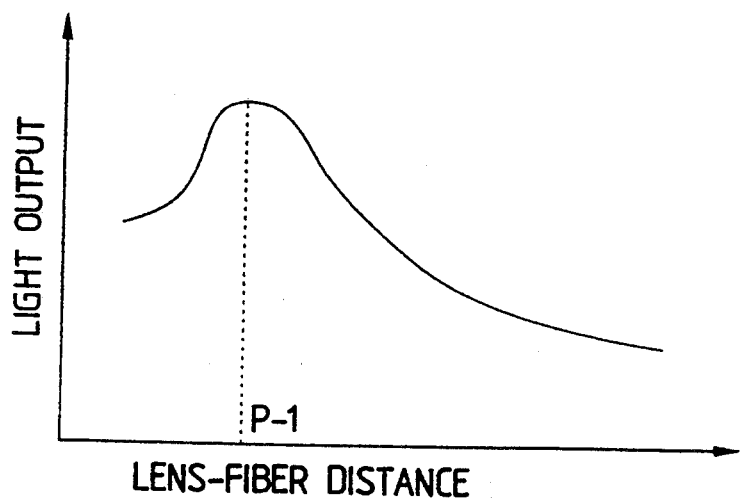
FIG. 5 is a graph used for describing a first method of adjusting the optical coupling efficiency between the optical fiber and an optical element.

FIG. 5 is a graph showing a variation of the optical coupling state of the optical fiber 61 when the distance between the end face of the optical fiber 61 and the sphere lens 31 is changed by advancing or retreating the ferrule 62 in the Z-direction. As shown in FIG. 5, the optical coupling efficiency varies with the end face position of the optical fiber 61 with a position P-1 as a peak position. That is, as the ferrule 62 is gradually retreated in the Z-direction after inserting it deeply, the light output gently increases until reaching the peak at the position P-1 and thereafter decreases.

Figure 6:
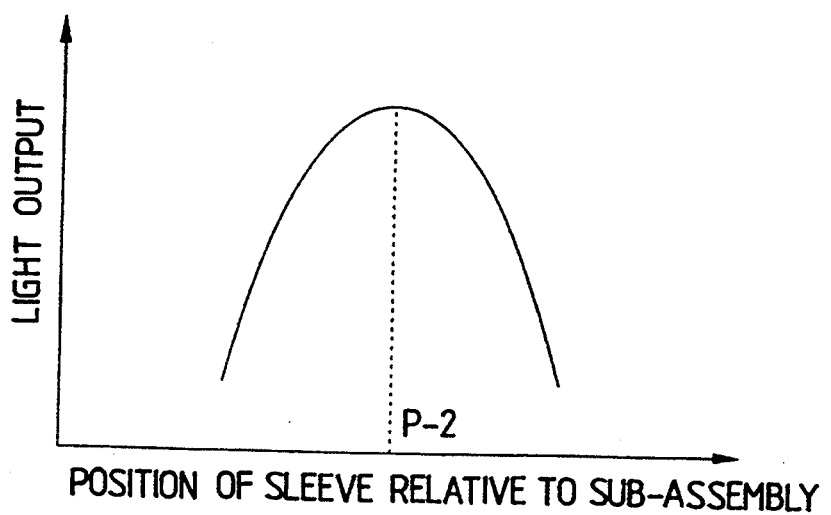
FIG. 6 is a graph used for describing a second method of adjusting the optical coupling efficiency between the optical fiber and the optical element.

FIG. 6 is a graph showing a variation of the optical coupling state of the optical fiber 61 when the distance between the optical axis of the end portion of the optical fiber 61 and that of the sphere lens 31 is changed by translating the ferrule 62 in the X-direction together with the sleeve 63. As shown in FIG. 6, a peak appears at a position P-2 and the optical coupling efficiency decreases as the ferrule 62 and the sleeve 63 moves away from the position P-2.

Figure 7A:
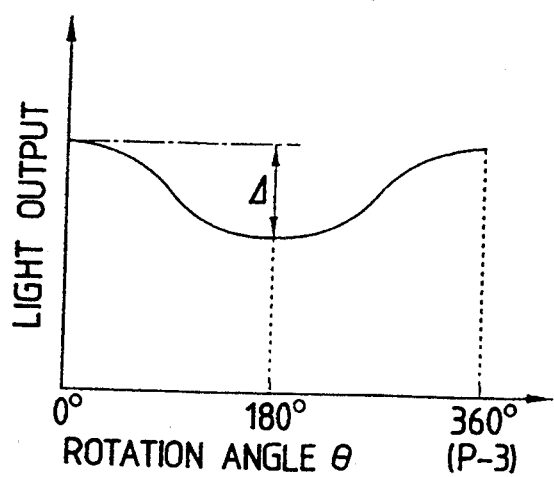
FIG. 7(a) is a graph used for describing a third method of adjusting the optical coupling efficiency between the optical fiber and the optical element.

Further, FIG. 7(a) is a graph showing a variation of the optical coupling state of the optical fiber 61 when the ferrule 62 is rotated by the angle 8. As shown in FIG. 7(a), the optical coupling efficiency varies with a period corresponding to one rotation of the ferrule 62 with a rotational position P-3 as a peak position.

Figure 7B:
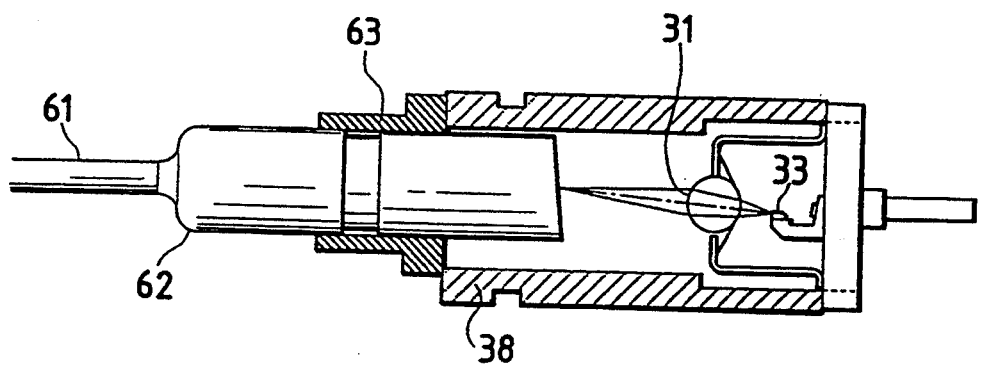
FIGS. 7(b) and 7(c) are sectional views used for describing the third method of adjusting the optical coupling efficiency between the optical fiber and the optical element.
Figure 7C:
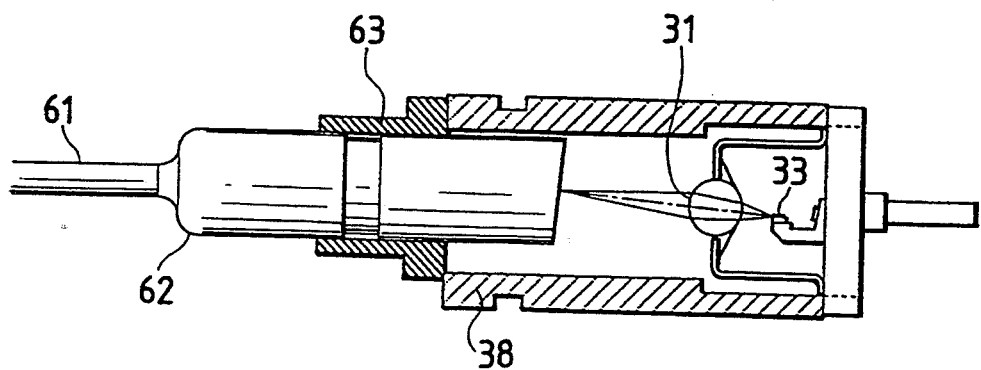

As shown in FIGS. 7(b) and 7(c), it is advantageous that the end face of the ferrule 62, together with the end face of the optical fiber 61, be ground so as to be inclined from the plane perpendicular to the optical axis of the optical fiber 61. Originally, in transmission optical modules using a laser diode as a light source, the end face of the ferrule is ground to incline it to thereby prevent the return light reflected from the ferrule end face from making the oscillation state of the laser diode unstable. Besides this advantage, the present embodiment utilizes another advantage obtained by grinding the ferrule end face to incline it.

That is, by inclining the end face of the ferrule 62 by grinding, the distribution of the output light or input light at the end face of the optical fiber 61 deviates in accordance with the inclination of the end face of the ferrule 62, as a result of which the central axis of the output or input light beam forms a certain angle with the central axis of the optical fiber 61. Therefore, when the ferrule 62 is rotated, the optical coupling efficiency between the optical fiber 61 and the optical element varies as shown in FIGS. 7(b) and 7(c).

As described above, in the manufacturing method according to the invention, there are three methods for adjusting the optical coupling efficiency between the optical fiber 61 and the optical element. In a practical sense, it is advantageous that first the adjustment in the direction (X-direction) perpendicular to the optical axis be performed to obtain the maximum optical coupling efficiency and then the adjustment in the optical axis direction (Z-direction) be performed to obtain an appropriate light output. This is because the rapid variation of the light output with respect to the movement of the ferrule 62 in the X-direction makes it difficult to perform precise adjustment. From another viewpoint, since only a slight shift in the X-direction of the ferrule 62 causes a large variation of the optical coupling efficiency of the optical module, the optical module tends to have low long-term stability of the optical coupling efficiency if the optical coupling efficiency is finally adjusted in the X-direction.

An experiment was performed by producing an optical module using a single-mode optical fiber as the optical fiber 61 and a laser diode as the optical element. A preliminary adjustment was made in the X-direction to provide the maximum light output. When the ferrule 62 was moved in the Z-direction by 500 $\mu$m, the light output decreased by 8 dB from the maximum value. This means that if an optical module having an adjustment range of 500 $\mu$m is produced, the light output can be adjusted within an 8-dB range.

In the adjustment method of rotating the ferrule 62 having the end face inclined by grinding, the adjustable range is determined by the offset of the optical element from the optical axis of the sphere lens 31 and the inclination angle of the end face of the ferrule 62. As an specific example, when the offset is 50 $\mu$m and the inclination angle of the ferrule end face is 4°, the light output has a variation range of 3 dB with the rotation of the ferrule 62. To perform the entire adjustment only by moving the ferrule 62 in the Z-direction, it may be necessary to make the total length of the optical module excessively large. Therefore, it is better to also use the adjustment by the ferrule rotation.

Figure 8:
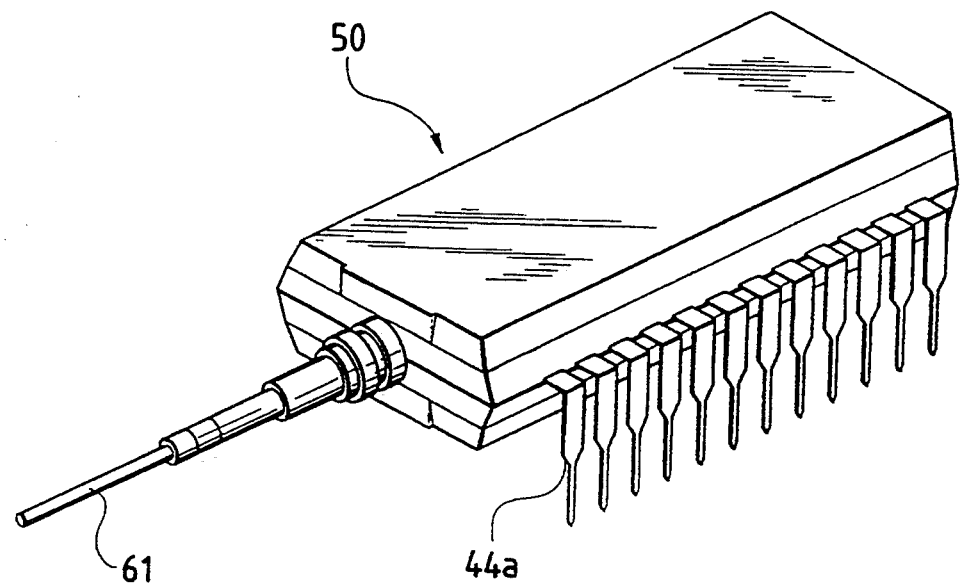
FIG. 8 is a perspective view showing an appearance of an optical module produced by the manufacturing method of the invention.
Figure 9:
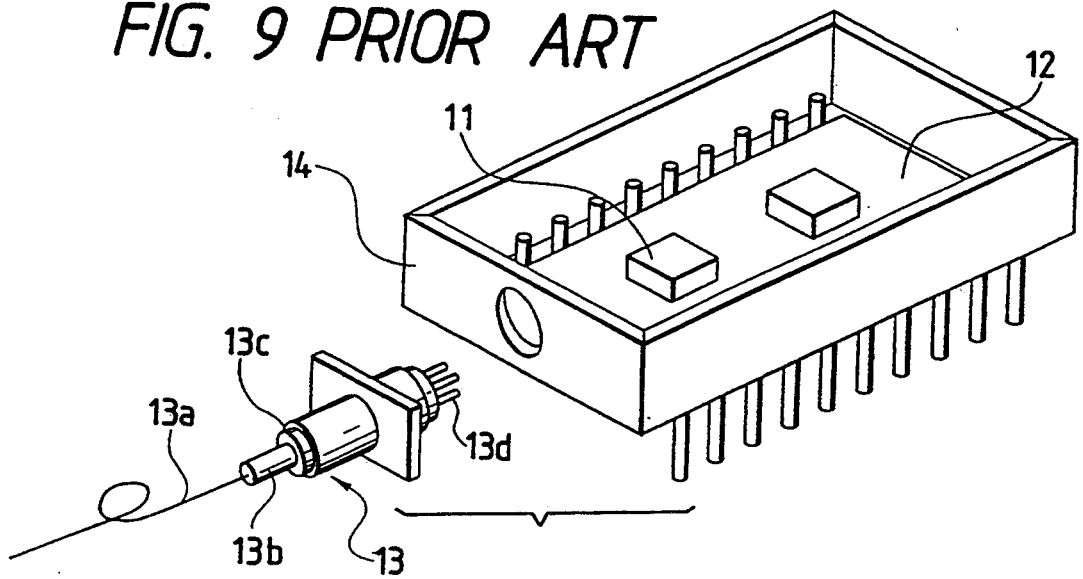
FIG. 9 is a perspective view illustrating a structure of a conventional optical module and a manufacturing method therefor.
Figure 10:
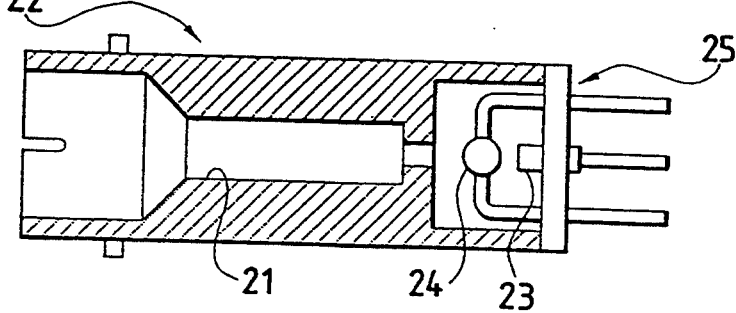
FIG. 10 is a sectional view showing a typical structure of a sub-assembly used in the conventional optical module of FIG. 9.

FIG. 8 shows an appearance of the optical module completed by the above-described manufacturing process. As shown, after the light output is adjusted by the above method, the ferrule 61, sleeve 61 and sub-assembly 30 are fixed to each other by, for instance, laser welding, to complete the optical module.

As described above, according to the adjustment method of the invention in which the ferule is linearly moved or rotated, the light output can be adjusted in a wide range and precise adjustment can be made easily. Therefore, variations in the characteristics of the optical element and the sub-assembly can be compensated in wide ranges by the adjustment at the time of the optical module production without adjusting the drive current or with only a slight adjustment thereof. As a result, the manufacturing process of the optical module can be simplified and allowable ranges of the characteristics of the sub-assembly and the optical element are broadened, to thereby greatly improve the productivity and the production cost.

According to the manufacturing method of the invention, it becomes possible to produce the pigtail-type optical module which includes even the optical fiber as a member of the single unit using the transfer molding technique. That is, the optical fiber is attached after the completion of the transfer molding step.

Enabling the mass-production of the pigtail-type optical module at low cost with uniform characteristics, it is expected that the invention will accelerate the development of the optical communication systems.

What is claimed is:

1. A method for manufacturing a pigtail-type optical module comprising an optical fiber, an optical element and an electronic circuit, the optical fiber and the optical element being optically coupled, the optical element and the electronic circuit being electrically connected, the method comprising the steps of:

transfer molding an assembly comprising the optical element, a holder portion capable of receiving a ferrule, and the electronic circuit, to produce a molded single unit assembly;

inserting the ferrule attached to an end portion of the optical fiber into the holder portion of the molded single unit assembly, and adjusting an optical coupling efficiency between the optical fiber and the optical element by moving the ferrule within the holder portion of the molded single unit assembly.

2. The method of claim 1, wherein a central axis of a light beam for coupling the optical element and an end face of the optical fiber forms a predetermined angle with an insertion direction of the ferrule, and wherein the step of adjusting comprises the step of moving the ferrule in and opposite to its insertion direction.

3. The method of claim 1, wherein an inner diameter of the holder portion of the molded single unit assembly is sufficiently larger than an outer diameter of the ferrule, and wherein the step of adjusting comprises the step of moving the ferrule in a direction perpendicular to the insertion direction of the ferrule.

4. The method of claim 1, further comprising the step of grinding an end face of the optical fiber so that the end face is inclined from a plane perpendicular to an optical axis of the end portion of the optical fiber, the step of grinding occurring prior to the step of adjusting; and wherein the step of adjusting comprises the step of rotating the ferrule axially about its insertion direction.

5. A method for manufacturing a pigtail-type optical module comprising an optical fiber, an optical element and an electronic circuit, the optical fiber and the optical element being coupled by a light beam having a central axis being a predetermined angle with a central axis of a ferrule, the method comprising the steps of:

transfer molding an assembly comprising the optical element, a holder portion capable of receiving a ferrule, and the electric circuit to produce a single unit assembly; said inner diameter of the holder portion being larger than an outer diameter of the ferrule;

grinding an end face of the optical fiber so that an end face of the optical fiber is inclined from a plane perpendicular to an optical axis of the end portion of the optical fiber;

attaching the optical fiber end portion to the ferrule so that the central axis of the ferrule and the optical fiber are substantially shared;

inserting the ferrule attached to the optical fiber end portion into the holder portion of the molded single unit assembly;

adjusting an optical coupling efficiency between the optical element and the optical fiber by moving the ferrule in and opposite to its insertion direction, by moving the ferrule in a direction perpendicular to the insertion direction of the ferrule, and by rotating the ferrule axially about its insertion direction.

* * * * *